(12) United States Patent
Prohaska et al.

(10) Patent No.: US 10,634,701 B2
(45) Date of Patent: Apr. 28, 2020

(54) METER PROBE APPARATUS

(71) Applicant: Eaton Corporation, Cleveland, OH (US)

(72) Inventors: Richard Prohaska, Cleveland, TN (US); Rudy Beaty, Cleveland, TN (US); James W. Adams, Chatsworth, GA (US)

(73) Assignee: Eaton Intellectual Power Limited, Dublin (IE)

( * ) Notice: Subject to any disclaimer, the term of this patent is extended or adjusted under 35 U.S.C. 154(b) by 277 days.

(21) Appl. No.: 15/817,900

(22) Filed: Nov. 20, 2017

(65) Prior Publication Data

US 2019/0154732 A1    May 23, 2019

(51) Int. Cl.
| | |
|---|---|
| *G01R 15/12* | (2006.01) |
| *G01R 19/00* | (2006.01) |
| *G01R 1/067* | (2006.01) |
| *G01R 1/073* | (2006.01) |
| *G01R 15/00* | (2006.01) |

(52) U.S. Cl.
CPC ......... *G01R 15/00* (2013.01); *G01R 1/06788* (2013.01); *G01R 19/0084* (2013.01)

(58) Field of Classification Search
CPC ........ G01R 15/00; G01R 15/12; G01R 19/00; G01R 1/067; G01R 1/06772; G01R 1/06788; G01R 1/0416; G01R 1/0694; G01R 1/06705; G01R 1/06777; G01R 1/073
See application file for complete search history.

(56) References Cited

U.S. PATENT DOCUMENTS

| | | | | |
|---|---|---|---|---|
| 4,209,742 A | * | 6/1980 | Bender | .............. G01R 1/06788 324/72.5 |
| 2002/0093355 A1 | * | 7/2002 | Parker | ................ G01R 1/07314 324/755.05 |

* cited by examiner

*Primary Examiner* — Neel D Shah
(74) *Attorney, Agent, or Firm* — Benesch, Friedlander, Coplan & Aronoff LLP

(57) ABSTRACT

A voltmeter probe has a metal probe tip projecting from an elongated insulating handle. The handle has a longitudinal axis and a radially projecting finger guard with an inner diameter and an outer diameter. A barrier covers the terminal. The barrier has an aperture configured to provide access for the probe tip to be inserted through the barrier into contact with the terminal, including access for the finger guard to be inserted through the barrier. The aperture has dimensions of length and width, including no width that is not less than the outer diameter of the finger guard.

20 Claims, 3 Drawing Sheets

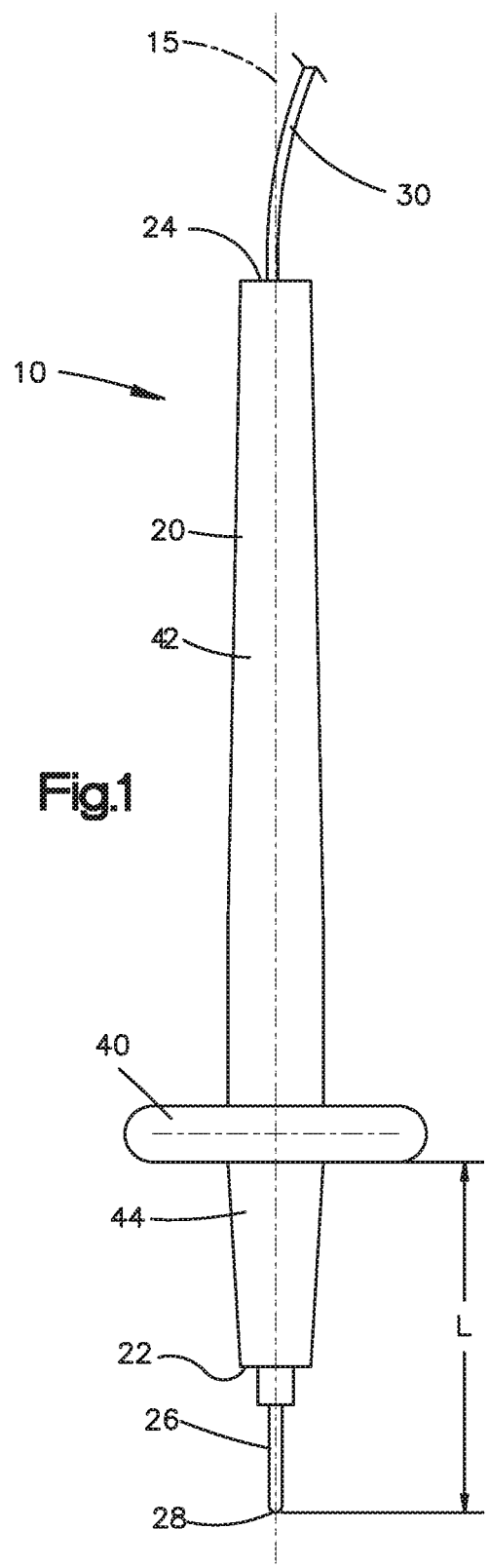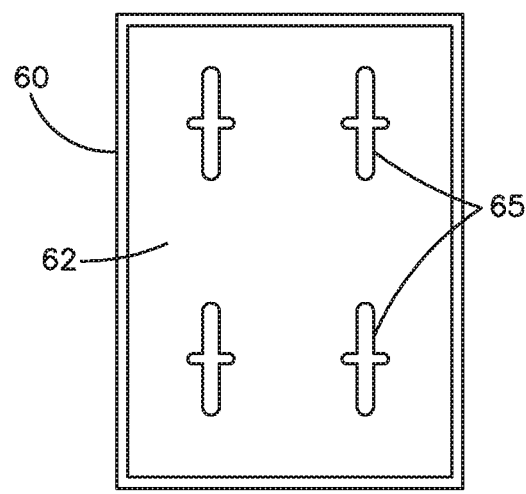

METER PROBE APPARATUS

TECHNICAL FIELD

This technology relates to a barrier for covering an electrical terminal, and relates particularly to a barrier with an aperture for a voltmeter probe to be inserted through the barrier into contact with an electrical terminal.

BACKGROUND

An electrical terminal can be tested with a voltmeter including a hand-held probe. Such a probe typically has a narrow, elongated handle with a probe tip projecting lengthwise from one end. As a safety feature, the handle may have a finger guard projecting radially outward to block a user's fingers from sliding forward along the handle into contact with the probe tip. In some cases the terminal is covered by a protective barrier with an aperture for the probe to be inserted through the barrier. However, the finger guard on the handle may block the probe from being inserted through the aperture far enough to reach the terminal.

SUMMARY

An apparatus is provided for use with an electrical terminal and a voltmeter probe. The probe has a metal probe tip projecting from an elongated insulating handle. The handle has a longitudinal axis and a radially projecting finger guard with an inner diameter and an outer diameter. The apparatus comprises a barrier configured to cover the terminal. The barrier has an aperture configured to provide access for the probe tip to be inserted through the barrier into contact with the terminal, including access for the finger guard to be inserted through the barrier. The aperture has dimensions of length and width, including no width that is not less than the outer diameter of the finger guard.

In a given example, the aperture has a first elongated section with a length greater than the outer diameter of the finger guard. The aperture further has second and third elongated sections. The second elongated section projects orthogonally from the first elongated section, and has a width greater than the inner diameter of the finger guard. The third elongated section projects from the first elongated section oppositely from the second elongated section, and also has a width greater than the inner diameter of the finger guard.

BRIEF DESCRIPTION OF THE DRAWINGS

FIG. 1 is a side view of a voltmeter probe.

FIG. 2 is a schematic front view of an enclosure for electrical terminals.

DETAILED DESCRIPTION

Figure 3:
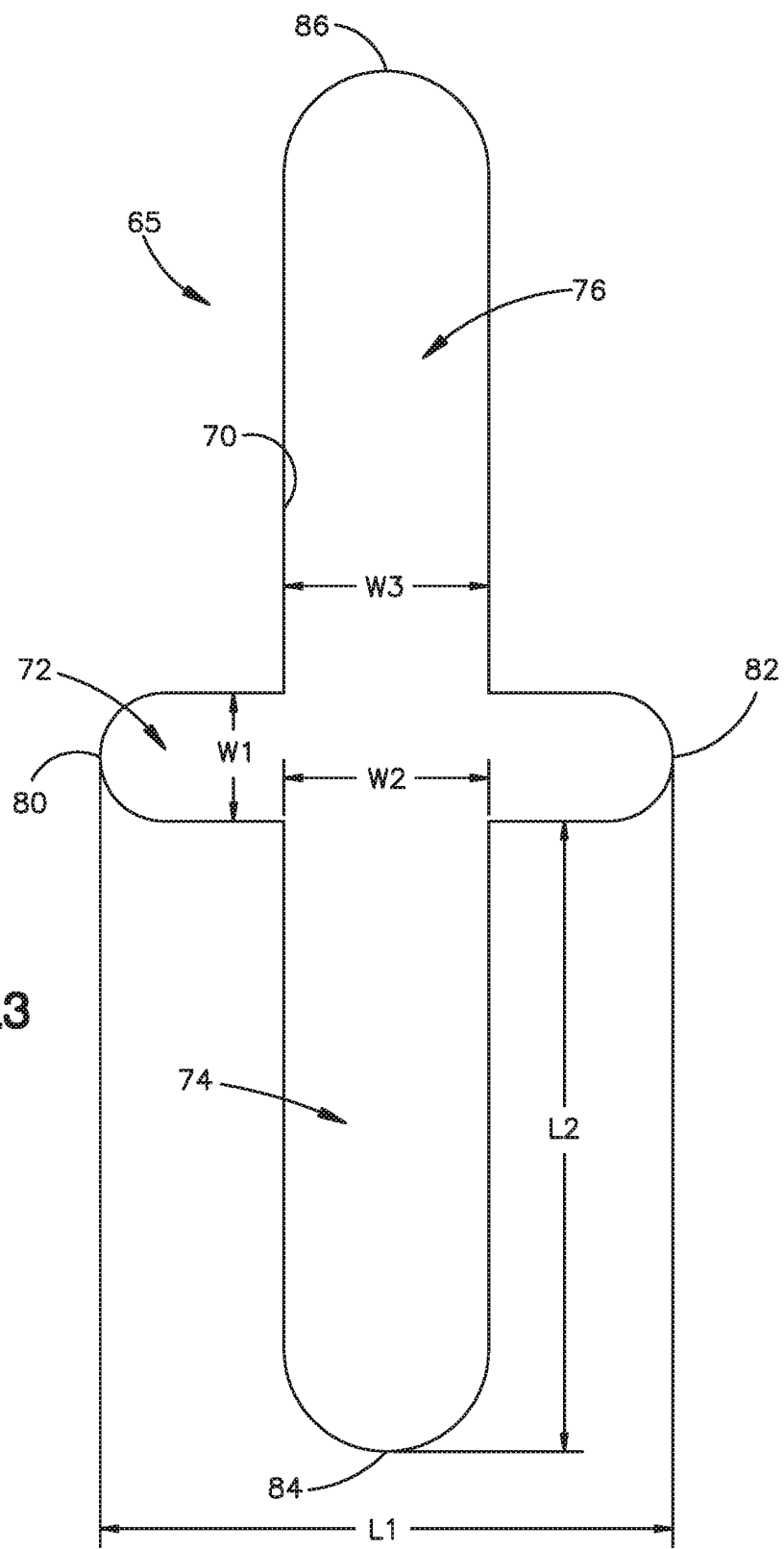
FIG. 3 is an enlarged view of an aperture in the enclosure of FIG. 2.

The structures illustrated in the drawings include examples of the elements recited in the claims. The illustrated structures thus include examples of how a person of ordinary skill in the art can make and use the claimed invention. These examples are described to meet the enablement and best mode requirements of the patent statute without imposing limitations that are not recited in the claims. One or more of the elements of one embodiment may be used in combination with, or as a substitute for, one or more elements of another as needed for any particular implementation of the claimed invention.

As shown in FIG. 1, a voltmeter probe 10 has an elongated, generally cylindrical shape centered on a longitudinal axis 15. The probe 10 includes an electrically insulating handle 20 with axially inner and outer ends 22 and 24. A metal probe tip 26 projects from the inner end 22 along the axis 15. The probe tip 26 has a free end 28 for making operative contact with an electrical terminal. An electrical lead 30 reaches outward from the outer end 24 of the handle 20. The lead 30 connects with a voltmeter as known in the art.

The handle 20 further has a circular flange 40 projecting radially outward at a short distance axially from the inner end 22. A gripping portion 42 of the handle 20 reaches axially outward from the flange 40. A forward portion 44 of the handle 20 reaches axially inward from the flange 40. In this configuration, the flange 40 serves as a finger guard that can block a user's fingers from sliding forward along the handle 20 into contact with the probe tip 26.

As partially shown in FIG. 2, an enclosure 60 contains panel 62 that serves as a protective barrier covering electrical terminals (not shown) contained in the enclosure 60. The barrier 62 has an array of apertures 65 at locations corresponding to the locations of the terminals to provide access for the probe 10 to reach the terminals through the barrier 62.

Figure 4:
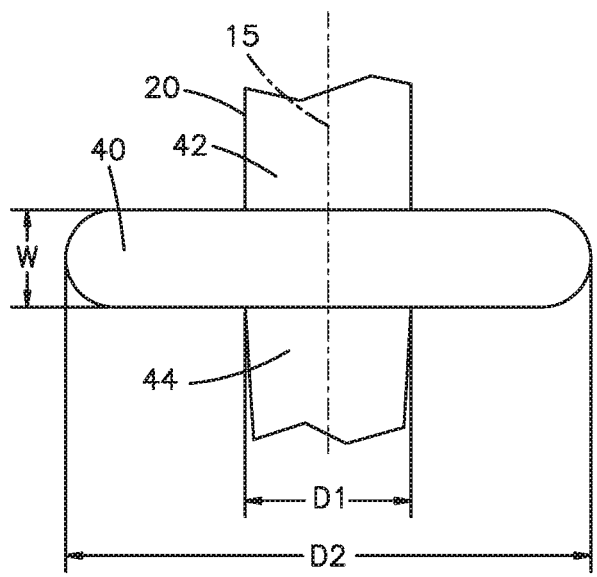
FIG. 4 is an enlarged partial view of the probe of FIG. 1.

The apertures 65 are preferably alike, with each having the configuration of the example shown in enlarged detail in FIG. 3. In this example, the aperture 65 is cross-shaped with a closed periphery defined by a continuous inner edge 70 of the barrier 62. The cross-shape is defined by multiple elongated sections 72, 74 and 76 of the aperture 65. The dimensions of the sections 72, 74 and 76 are determined with reference to dimensions of the probe 10. Specifically, the probe 10 has a partial length L (FIG. 1) from the flange 40 to the free end 28 of the probe tip 26. As shown in FIG. 4, the flange 40 has an inner diameter D1, an outer diameter D2, and an axial width W.

The first section 72 of the aperture 65 has a length L1 and a width W1. The length L1 is greater than the outer diameter D2 of the flange 40. The width W1 is greater than the axial width W of the flange 40.

The second section 74 of the aperture 65 projects orthogonally from the first section 72 with a length L2 and a width W2. The width W2 is greater than the inner diameter D1 of the flange 40. The length L2 is greater than the partial length L of the probe 10.

The third section 76 of the aperture 65 projects from the first section 72 oppositely relative to the second section 74, and also has a width W3 that is greater than the inner diameter D1 of the flange 40.

Additionally, in the symmetrical arrangement shown in FIG. 3, the terminal ends 80 and 82 of the first section 72 of the aperture 65 are equally spaced from the second and third sections 74 and 76. The terminal ends 84 and 86 of the second and third sections 74 and 76 are equally spaced from the first section 72.

The aperture 65 has no width that is greater than the outer diameter D2 of the flange 40. This blocks the flange 40 from being moved inward through the aperture 65 in an axially forward direction. However, the flange 40 can be moved inward through the aperture 65 by first placing the probe 10 adjacent to the barrier 62 in a position shown partially in FIG. 5. In this position, the flange 40 is oriented in lengthwise alignment with the first section 72 of the aperture 65. The forward portion 44 of the handle 20 is oriented in lengthwise alignment with the second section 74 of the aperture 65. The gripping portion 42 of the handle 20 is likewise oriented in lengthwise alignment with third section 76 of the aperture 65.

Figure 5:
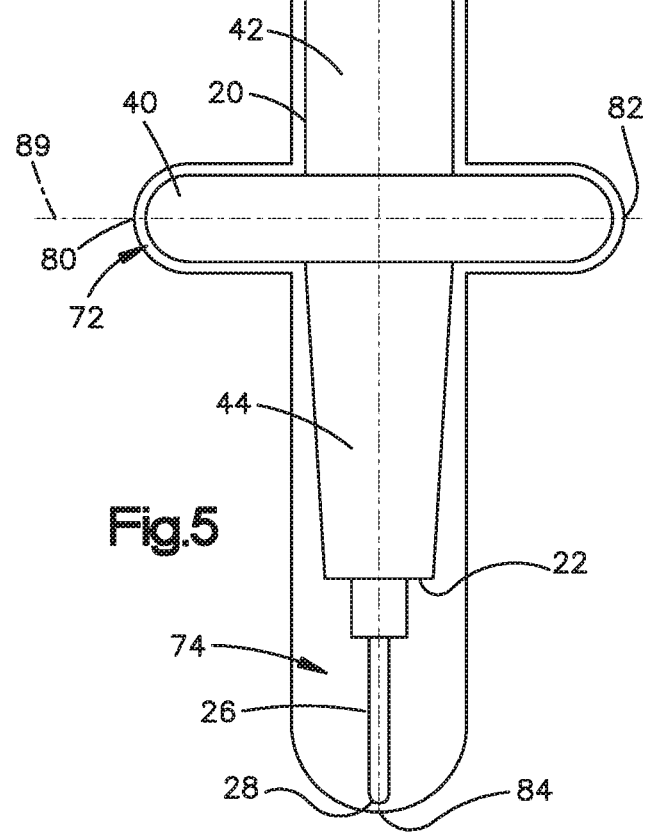
FIG. 5 is a partial view showing parts of the probe and enclosure in aligned positions.

When the probe 10 is in the position of FIG. 5, the user can move the flange 40 inward through the first section 72 of the aperture 65. This is accomplished by tilting the probe 10 about a transverse axis 89 to move the flange 40 pivotally inward. The probe tip 26 and the forward portion 44 of the handle 20 simultaneously move pivotally inward through the second section 74 of the aperture 65 as the flange 40 moves pivotally inward through the first section 72. When the flange 40, the probe tip 26, and the forward portion 44 of the handle 20 have been moved through the aperture 65 in this manner, the gripping portion 42 of the handle 20 can be advanced axially inward through the aperture 65 as needed for the free end 28 of the probe tip 26 to reach the associated electrical terminal behind the protective barrier 62. The user's fingers remain protected at the exterior of the barrier 62.

This written description sets for the best mode of carrying out the invention, and describes the invention so as to enable a person of ordinary skill in the art to make and use the invention, by presenting examples of the elements recited in the claims. The detailed descriptions of those elements do not impose limitations that are not recited in the claims, either literally or under the doctrine of equivalents.

What is claimed is:

1. An apparatus comprising: a voltmeter probe having a metal probe tip projecting from an elongated insulating handle, wherein the handle has a longitudinal axis and a radially projecting finger guard with an inner diameter and an outer diameter; and a barrier configured to cover an electrical terminal and having an aperture configured to provide access for the probe tip to be inserted through the barrier into contact with the electrical terminal, including access for the finger guard to be inserted through the barrier, wherein the aperture has a peripheral shape with orthogonal sections, each of which has dimensions of length and width, including no width that is not less than the outer diameter of the finger guard.

2. An apparatus as defined in claim 1 wherein the peripheral shape of the aperture has a first elongated section with a length greater than the outer diameter of the finger guard.

3. An apparatus as defined in claim 2 wherein the finger guard has an axial width, and the first elongated section of the peripheral shape of the aperture has a width greater than the axial width of the finger guard.

4. An apparatus as defined in claim 2, wherein the peripheral shape of the aperture has a second elongated section that projects orthogonally from the first elongated section and has a width greater than the inner diameter of the finger guard.

5. An apparatus as defined in claim 4 wherein the voltmeter probe has a partial length reaching from the finger guard to a free end of the probe tip, and the second elongated section of the peripheral shape of the aperture has a length greater than the partial length of the voltmeter probe.

6. An apparatus as defined in claim 1 wherein the barrier is configured to cover a plurality of electrical terminals, and the aperture is one of a plurality of apertures that are alike and are arranged on the barrier in positions corresponding to positions of the electrical terminals.

7. An apparatus for use with an electrical terminal and a voltmeter probe having a metal probe tip projecting from an elongated insulating handle, wherein the handle has a longitudinal axis and a radially projecting finger guard with an inner diameter and an outer diameter, the apparatus comprising:
    a barrier configured to contain the terminal and having an aperture configured to provide access for probe tip to be inserted through the barrier into contact with the terminal, including access for the finger guard to be inserted through the barrier, wherein the aperture has a peripheral shape with orthogonal sections, each of which has dimensions of length and width, including:
    a first elongated section having a length greater than the outer diameter of the finger guard;
    a second elongated section projecting orthogonally from the first elongated section and having a width greater than the inner diameter of the finger guard; and
    a third elongated section projecting from the first elongated section oppositely relative to the second elongated section and also having a width greater than the inner diameter of the finger guard.

8. An apparatus as defined in claim 7 wherein the finger guard has an axial width, and the first elongated section has a width greater than the axial width of the finger guard.

9. An apparatus as defined in claim 7 wherein the first elongated section has terminal opposite ends spaced equally from the second and third elongated sections.

10. An apparatus as defined in claim 7 wherein the width of the second elongated section is less than the outer diameter of the finger guard.

11. An apparatus as defined in claim 7 wherein the width of the third elongated section is less than the outer diameter of the finger guard.

12. An apparatus as defined in claim 7 wherein the voltmeter probe has a partial length reaching from the finger guard to a free end of the probe tip, and the second elongated section of the peripheral shape of the aperture has a length greater than the partial length of the voltmeter probe.

13. An apparatus as defined in claim 7 wherein the second and third elongated sections have terminal ends spaced equally from the first elongated section.

14. An apparatus as defined in claim 7 wherein the barrier is configured to cover a plurality of electrical terminals, and the aperture is one of a plurality of apertures that are alike and are arranged on the barrier in positions corresponding to positions of the electrical terminals.

15. An apparatus for use with an electrical terminal and a voltmeter probe having a metal probe tip projecting from an elongated insulating handle, wherein the handle has a longitudinal axis and a radially projecting finger guard with an axial width, an inner diameter, and an outer diameter, the apparatus comprising:
    a barrier configured to cover the terminal and having an aperture configured to provide access for probe tip to be inserted through the barrier into contact with the terminal, including access for the finger guard to be inserted through the barrier, wherein the aperture has a peripheral shape with orthogonal sections, each of which has dimensions of length and width, including:
    a first elongated section having a length greater than the outer diameter of the finger guard, and having a width greater than the axial width of the finger guard;
    a second elongated section projecting orthogonally from the first elongated section, the second elongated section having a width greater than the inner diameter of the finger guard, and having a length greater than a length of the voltmeter probe from the finger guard to a terminal end of the probe tip; and a third elongated section projecting from the first elongated section oppositely relative to the second elongated section, and also having a width greater than the inner diameter of the finger guard.

16. An apparatus as defined in claim 15 wherein the first elongated section has terminal opposite ends spaced equally from the second and third elongated sections.

17. An apparatus as defined in claim 15 wherein the second and third elongated sections have terminal ends spaced equally from the first elongated section.

18. An apparatus for use with an electrical terminal and a voltmeter probe having a metal probe tip projecting from an elongated insulating handle, wherein the handle has a longitudinal axis and a radially projecting finger guard with an inner diameter and an outer diameter, the apparatus comprising:

a barrier configured to cover the terminal and having an aperture configured to provide access for the probe tip to be inserted through the barrier into contact with the terminal, including access for the finger guard to be inserted through the barrier, wherein the aperture has a peripheral shape with orthogonal sections, each of which has dimensions of length and width, including no width that is not less than the outer diameter of the finger guard;

wherein aperture has a first elongated section with a length greater than the outer diameter of the finger guard;

wherein the aperture has a second elongated section that projects orthogonally from the first elongated section and has a width greater than the inner diameter of the finger guard; and wherein the aperture has a third elongated section projecting from the first elongated section oppositely relative to the second elongated section, and the third elongated section also has a width greater than the inner diameter of the finger guard.

19. An apparatus as defined in claim 18 wherein the first elongated section has terminal opposite ends spaced equally from the second and third elongated sections.

20. An apparatus as defined in claim 18 wherein the second and third elongated sections have terminal ends spaced equally from the first elongated section.

* * * * *